United States Patent [19]

Negus et al.

[11] Patent Number: 4,560,943
[45] Date of Patent: Dec. 24, 1985

[54] F.M. DEMODULATOR WITH FAIL-SAFE FEATURES

[75] Inventors: Paul D. Negus, Bath; Tak C. Ng, Chippenham; Roger Badge, Pucklechurch; David W. Cowen, Corsham, all of England

[73] Assignee: Westinghouse Brake & Signal Co. Ltd., Chippenham, England

[21] Appl. No.: 493,915

[22] Filed: May 12, 1983

[30] Foreign Application Priority Data

May 13, 1982 [GB] United Kingdom ............. 8213995

[51] Int. Cl.$^4$ .................... H03D 3/00; H03D 3/02
[52] U.S. Cl. ............................. 329/103; 329/110; 329/137; 329/145; 329/167; 455/214; 455/337
[58] Field of Search ............... 329/103, 110, 137, 145, 329/167, 192; 455/214, 337; 333/138

[56] References Cited

U.S. PATENT DOCUMENTS

| | | | |
|---|---|---|---|
| 2,891,156 | 6/1959 | Crow | 329/103 |
| 3,748,586 | 7/1973 | Johnson et al. | 329/137 X |
| 3,764,927 | 10/1973 | Allinger et al. | 329/137 X |
| 4,119,919 | 10/1978 | Sugawara | 329/137 X |
| 4,198,609 | 4/1980 | Ishigaki et al. | 455/214 X |
| 4,339,726 | 7/1982 | Miura | 329/145 X |

FOREIGN PATENT DOCUMENTS 1206906  9/1970  United Kingdom ............... 455/214

Primary Examiner—Eugene R. LaRoche
Assistant Examiner—D. C. Mis
Attorney, Agent, or Firm—J. B. Sotak

[57] ABSTRACT

An F.M. demodulator of the phase quadrature type is adapted for fail-safe operation and in particular for use in a railway signalling system. A Bessel band-pass filter is chosen for the design basis of the phase delay arm, its characteristics, failure modes and resulting effects are considered and the design adaptations required to avoid the potentially unsafe effects of failures are determined. Due to loss of failure in the unmodified filter design the slope of the phase characteristic can increase effectively broadening the filter bandwidth and reducing attenuation of out-of-band signals which could, as a result, provide a false output. The demodulator may be combined with a fiber-optic link to form part of a complete signaling transmission system.

6 Claims, 2 Drawing Figures

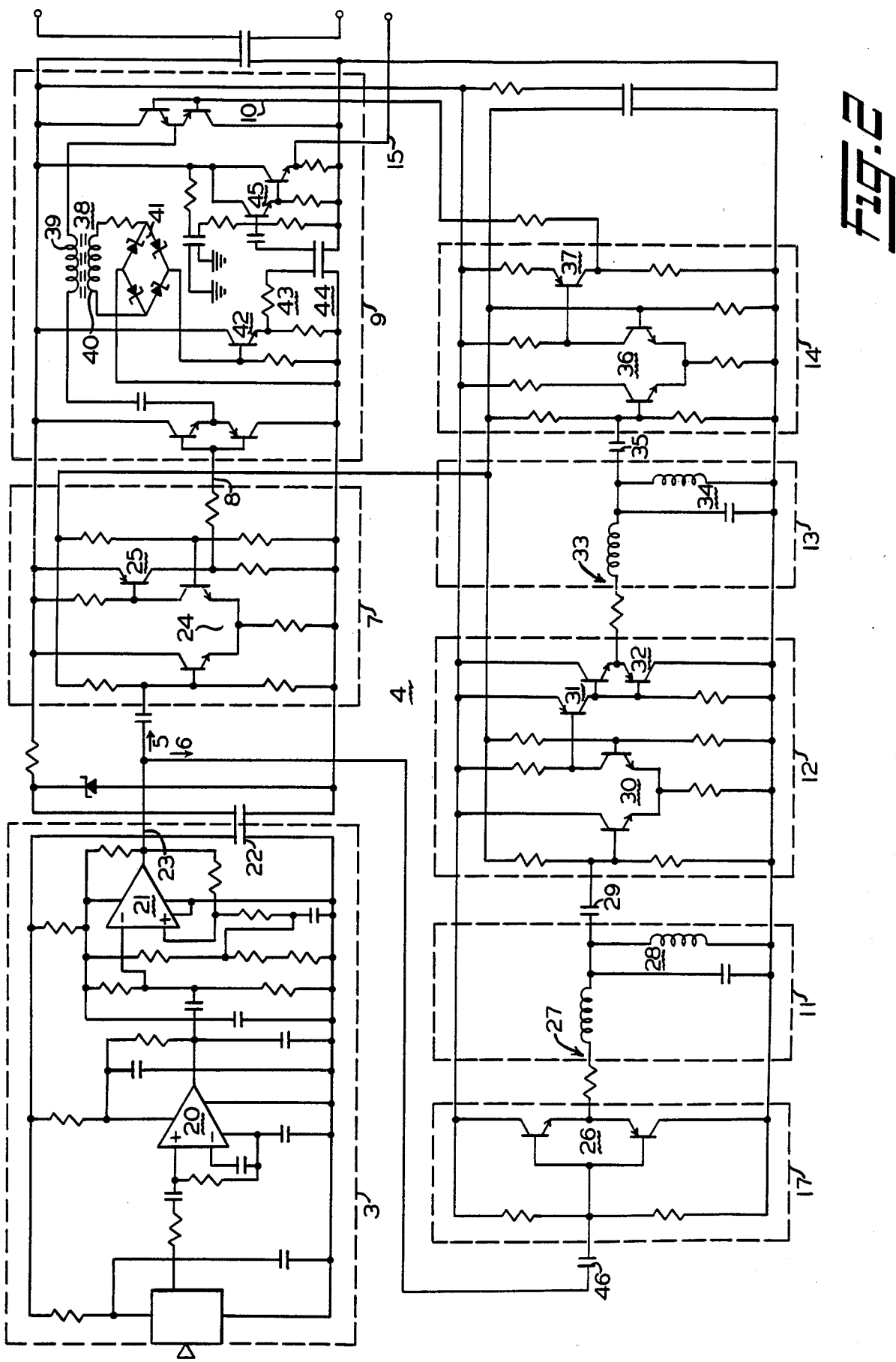

F.M. DEMODULATOR WITH FAIL-SAFE FEATURES

BACKGROUND OF THE INVENTION

The invention relates to an F.M. demodulator especially of the phase quadrature type.

FIELD OF THE INVENTION

An F.M. demodulator converts variations in the frequency domain of a modulated carrier into variations of amplitude at the modulating signal frequency. A phase quadrature type of demodulator does this by feeding the incoming frequency modulated carrier into two parallel signal paths, one relatively delayed to the other by a quarter cycle at the carrier signal frequency and then mixing the two relatively delayed signals followed by base band filtering to extract the modulating signal.

This type of demodulator design requires phase shifting networks that have a linear phase-frequency response in the working region. For example, a Bessel band-pass filter design can be arranged to provide a suitably linear phase response a fourth order filter possesses sufficient bandwidth and sensitivity without introducing too much complexity to a practical demodulator design. However, such conventional designs of band pass filter are not fail-safe; that is, under some component failure conditions the slope of the filter phase response characteristic will increase resulting in an increased output signal level and thereby creating potentially false inputs to a following signal detector.

OBJECTS AND SUMMARY OF THE INVENTION

The present invention seeks to provide an F.M. demodulator which is fail-safe, that is, the output signal level cannot increase regardless of the mode of failure of any component.

According to the present invention there is provided an F.M. demodulator comprising means for receiving an F.M. modulated signal, two parallel signal paths, means for mixing signals from the two paths to effect frequency demodulation and phase shifting means in one of signal paths operative to delay the phase of the signal one quarter of a cycle at the F.M. carrier frequency relative to the signal in the other path, said phase shifting means including in series two two-pole Bessel band-pass filter sections from which the capacitor in the series impedance arm has been omitted and the remaining components in the series and shunt impedance arms are selected to provide a linear frequency-phase change characteristic symmetrical with the required band-pass center frequency.

In a railway signalling fail-safe transmission system embodying the invention a frequency modulated signal is transmitted via a fiber-optic link to a receiver comprising an optical receiver means which converts a light signal to a frequency modulated electrical signal which is passed to a demodulator as described above and the demodulator output is connected to modulation frequency detecting means.

BRIEF DESCRIPTION OF THE DRAWINGS

The invention and how the same may be carried into practice will now be described, by way of example only, with reference to the accompanying drawings, in which:

FIG. 2 shows a circuit diagram of the F.M. demodulator of FIG. 1.

DETAILED DESCRIPTION OF THE INVENTION

Figure 1:
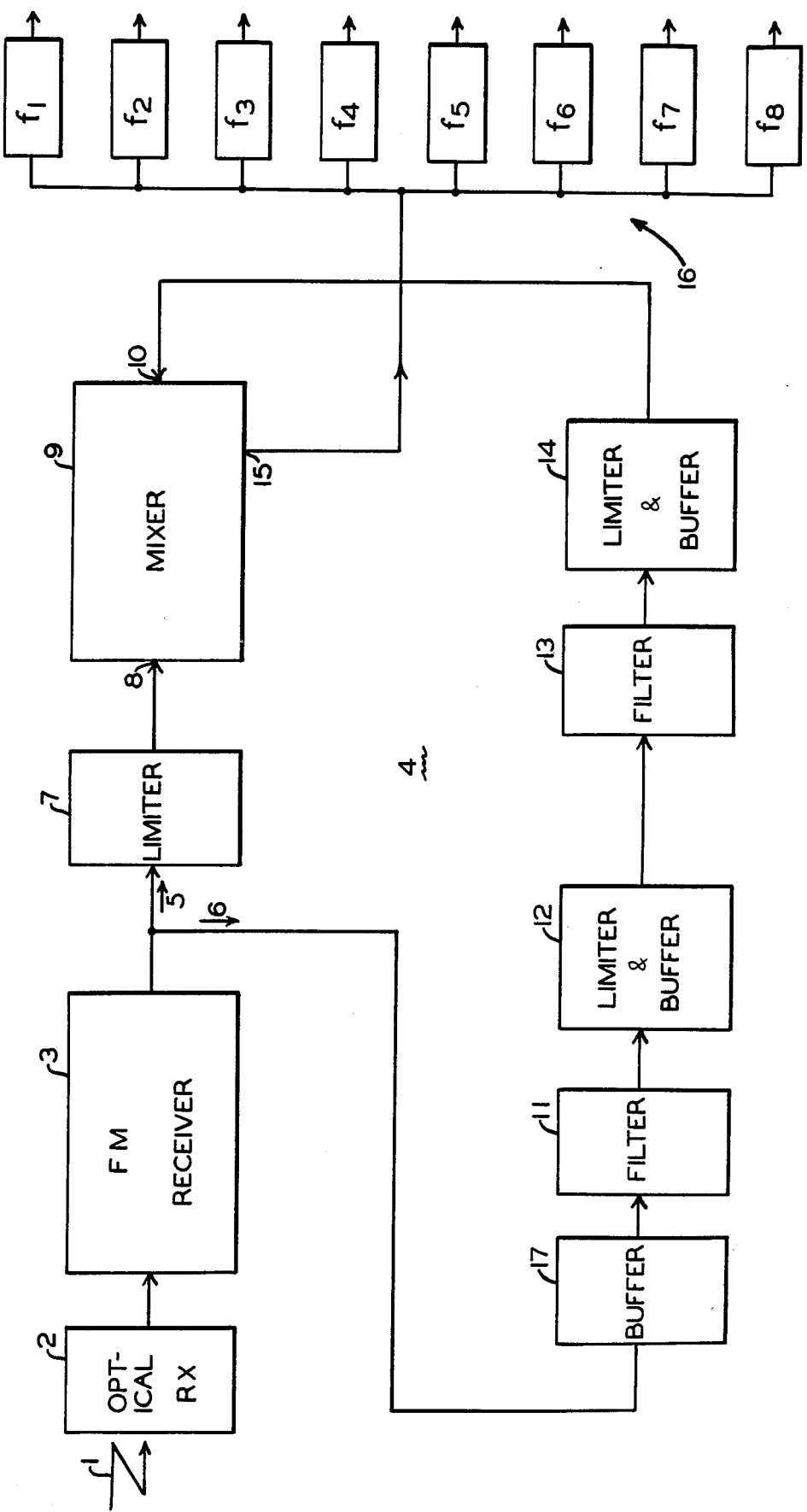
FIG. 1 shows a block diagram of the receiver part of a railway signalling frequency modulated fiber-optic fail-safe transmission system which includes an F.M. demodulator of the present invention.

Referring now to the drawings the transmission system shown in FIG. 1 is capable of carrying up to eight alternative modulation frequencies $f_1$–$f_8$ by means of a frequency modulated carrier. The F.M. modulated carrier signal is conveyed via a fiber-optic link, in known manner, chosen because it provides, amongst other advantages, freedom from interference and an inherent fail-safe ability. The fiber-optic link is indicated generally by reference 1 terminating at an optical receiver means 2 operative to convert the transmitted optical signal into an F.M. electrical signal which is boosted by an F.M. receiver 3 before being passed to the demodulator.

The demodulator generally indicated at 4 feeds the receiver output signal to two separate signal paths indicated by direction arrows 5 and 6. In the first path 5 the signal is passed through a limiter block 7 to a first input 8 of a mixer block 9. The second signal path 6 is connected to a second input 10 of mixer 9 through a buffer 17, a first two pole Bessel band pass filter 11, a limiter and buffer circuit 12, and a second two-pole Bessel band-pass filter 13, and associated limiter and buffer circuit 14. The demodulated signal from mixer output 15 is connected to a bank 16 of eight parallel band pass filters each of which is tuned to one of the eight modulating frequencies $f_1$ to $f_8$.

The demodulator 4 is of the phase quadrature type in which a first version of a received signal from receiver 3 is mixed with a second version relatively delayed at the carrier frequency by one quarter cycle which extracts the carrier modulating signal which is then detected by the appropriate filter of bank 16 within the pass band of which the modulating signal frequency lies.

The basic characteristic required of the circuits in signal path 6 is that they shall produce a phase delay of one quarter cycle at carrier frequency, of the available designs of phase shifting network available a Bessel band-pass filter was selected for its linear phase response. A fourth order filter was found to provide sufficient band width and sensitivity on one hand and, on the other hand not to introduce too much complexity into the phase shifting network design. Whereas a single four-pole filter network would provide the required phase shift it was found that under some circumstances resulting from certain component failures that the slope of the phase characteristic could increase thus providing a proportional increase in output signal level. Under the normal conditions of safety design applied to the present arrangement this consequence is considered unsafe therefore it is preferred to split the phase shifting network into two identical sections with the pole number and degree of phase shift divided equally. Therefore a two-pole Bessel band-pass filter design, as shown in more detail in FIG. 2 was chosen.

Referring now to FIG. 2 which shows the circuit diagram of the modulator in more detail the circuit diagram of the receiver 3 enclosed by a dashed line, shows a conventional receiver design employing a voltage follower amplifier 20 and a comparator 21 having hysteresis.

The power supply to receiver 3 is connected via a decoupling four-terminal capacitor 22. The receiver output 23 which comprises a frequency modulated electrical signal is divided into two signal paths 5 and 6 both of which lead eventually to the inputs 8 and 10 of demodulating mixer 9. The signal in path 5 is connected to the mixer input 8 through a limiter, enclosed within the dashed line 7, and which essentially comprises an emitter coupled difference amplifier 24 driving an output switching transistor 25 which drives the input 8.

The second signal path 6, as mentioned above, supplies the F.M. modulated carrier signal to buffer 17, phase shifting network 11, limiter and buffer 12, second phase shifting network 13, limiter and buffer 14 and thence to second input 10 of mixer 9. The phase shifting networks 11 and 13 are identical in design so that each produces one eighth cycle phase delay. The first phase shifting network 11 is driven by a pair of push-pull transistors 26 of buffer 17 a.c. coupled by capacitor 46 to the receiver output 23. The network 11 itself comprises a series impedance arm 27 comprising a resistor and inductor in series combination and a shunt impedance arm 28 consisting of a parallel combination of capacitor and inductor. The network 11 is a.c. coupled via capacitor 29 to a buffer stage 12 comprising an emitter coupled difference amplifier 30, a switching transistor 31 and a further push-pull transistor arrangement 32. The latter is coupled to phase shifting network 13 which, as previously mentioned, is identical to network 11 and comprises series impedance arm 33 and shunt impedance arm 34 which also is a.c. coupled by a capacitor 35 to drive into a further limiter and buffer stage 14 also comprising an emitter-coupled difference amplifier 36 and a switching transistor 37 the output of which is connected to input 10 of the mixer 9.

The conventional design of a two-pole Bessel bandpass filter comprising a series impedance arm a resistor inductor and capacitor in series combination and in a shunt impedance arm an inductor, capacitor and resistor in parallel combination. However, an unsafe condition occurs should the capacitor in the series impedance arm become short circuit because then the slope of the phase characteristic increases resulting in a proportional increase in output signal level. This is unsafe because it has the effect of reducing attenuation of frequencies adjacent the band width limits, i.e., the Q factor of the filter is reduced, so that the filter band width is effectively increased. According to the present invention the capacitor in the series impedance arm is omitted in order to remove this failure mode and its consequences. This now has the effect of shifting the center frequency of the filter band pass characteristic so that the remaining components have to be re-selected in order to provide the desired center frequency for the filter characteristic.

In practice the filter circuits 11 and 13 cannot now provide an increased signal output level under any failure conditions except in the circumstance of an increased load impedance. To guard against this possibility the filter circuits 11 and 13 are each a.c. coupled to drive an emitter coupled difference amplifier (also known as a long-tailed pair transistor amplifier) 30 and 36, respectively, in the buffer circuits 12 and 14. In both of these circuits the emitter coupled transistors are biased at the same voltage thus, if any member of the biasing chain undergoes a substantial change of value the switching transistor 31 or 37 following the long-tailed pair 30 and 36, respectively, will be driven into saturation in a conducting state or alternatively will be biased completely non-conducting. Thus, the result is that the signal at input 10 to the mixer 9 becomes a static d.c. level and the demodulator ceases operation.

In operation the emitter coupled difference amplifier circuits each produce phase inversion of their output relative to their input, i.e., a phase shift of 180°. Thus by employing two in the same signal path giving a total phase shift of 360° there is effectively no additional phase shift introduced in the path other than by means of the phase shift networks.

In another fail-safe aspect of the operation of the demodulator the mixing function of block 9 is carried out by a circuit comprising transformer 38, having an input winding 39 opposite ends of which are connected to the input terminals 8 and 10 and the output winding 40 of which is connected across the input terminals of zener bridge regulator 41. One of the bridge output terminals is connected to signal reference voltage, O-volts, and the other drives an active RC filter comprising input transistor 42 series impedance resistor 43, a shunt impedance four-terminal capacitor 44 and output driving transistors 45 which drive the demodulated frequency output to output terminal 15.

The transformer 38 provides a fail-safe exclusive OR function and cannot fail to a configuration which provides a mere OR function nor to a condition providing an AND gating function. The zener bridge regulator 41 in conjunction with the output RC filter 42, 43, 44 and 45 in combination limit the output voltage and therefore provide immunity from power supply fluctuations. The zener bridge possesses substantially zero temperature co-efficient thus providing a demodulator output signal amplitude which is substantially independent of temperature variation.

By way of example in one particlar embodiment the basic band-pass filter design of phase shifting network 11 and 13 provided a center frequency at 90 kHz and a band width of $\sqrt{2} \times 50$ kHz. When the series impedance arm capacitor is omitted the center frequency shifts to 100 kHz and the phase delay of each filter section becomes $-45°$. This also provides a linear working region extending between 80 kHz and 120 kHz which is sufficient to permit, in the context of the present example, a frequency deviation of 2 kHz for each of the eight modulation frequency channels.

Having thus described our invention, what we claim as new and desire to secure Letters Patent, is:

1. An F.M. demodulator comprising means for receiving an F.M. modulated signal, two parallel signal paths, means for mixing signals from the two paths to effect frequency demodulation and phase shifting means in one of signal paths operative to delay the phase of the signal one quarter of a cycle at the F.M. carrier frequency relative to the signal in the other path, said phase shifting means including in series to two two-pole Besel band-pass filter sections from which the respective capacitor in the series impedance arms has been omitted and the remaining components in the series and shunt impedance arms are selected to provide a linear frequency-phase change characteristic symmetrical with the required band-pass center frequency, each filter section includes said respective two-pole filter followed by a buffer circuit.

2. An F.M. demodulator as claimed in claim 1 wherein the buffer circuit comprises an emitter-coupled difference amplifier.

3. An F.M. demodulaor as claimed in claim 2 wherein in the buffer circuit the output of the emitter-coupled difference amplifier is connected to a non-inverting amplifier stage.

4. An F.M. demodulator as claimed in claim 3 wherein the non-inverting amplifier stage comprises a common emitter transistor stage in a circuit providing no emitter feedback resistor.

5. An F.M. demodulator as claimed in claim 1 wherein the means for mixing signals from the two signal paths comprises a circuit adapted to perform an exclusive OR function.

6. An F.M. demodulator as claimed in claim 5 wherein the means for mixing said signals comprises a transformer having an input winding to opposite ends of which are connected the two signal paths.

* * * * *